United States Patent
Huang et al.

(10) Patent No.: US 8,901,549 B2
(45) Date of Patent: Dec. 2, 2014

(54) ORGANIC LIGHT EMITTING DIODE TOUCH DISPLAY PANEL

(71) Applicant: HannStar Display Corp., New Taipei (TW)

(72) Inventors: Chien-Hsiang Huang, Tainan (TW); Kun-Hua Tsai, Tainan (TW); Jun-Shih Chung, Taichung (TW); Chun-Hsi Chen, Pingtung County (TW)

(73) Assignee: HannStar Display Corp., New Taipei (TW)

( * ) Notice: Subject to any disclaimer, the term of this patent is extended or adjusted under 35 U.S.C. 154(b) by 0 days.

(21) Appl. No.: 13/932,017

(22) Filed: Jul. 1, 2013

(65) Prior Publication Data
US 2014/0110683 A1    Apr. 24, 2014

(30) Foreign Application Priority Data

Oct. 23, 2012  (CN) .......................... 2012 1 0407618

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 27/32* | (2006.01) | |
| *G06F 3/041* | (2006.01) | |

(52) U.S. Cl.
CPC .............. *H01L 27/323* (2013.01); *G06F 3/041* (2013.01)

USPC .......... 257/40; 178/17 D; 178/19.03; 257/59; 257/72; 257/759; 257/E27.117; 257/E51.001; 257/E51.002; 257/E51.007; 257/E51.022; 257/E51.024; 313/483; 313/500; 313/504; 313/509; 345/39; 345/46; 345/82; 345/204; 345/205; 345/206; 345/694; 349/38; 349/39; 349/51; 349/52

(58) Field of Classification Search
CPC ..................................................... H01L 27/323
USPC ........... 178/17 D, 19.03; 257/40, 59, 72, 759, 257/E27.117, E51.001, E51.002, E51.007, 257/E51.022, E51.024; 313/483, 500, 504, 313/509; 345/39, 46, 82, 204–206, 694; 349/38, 39, 51, 52
See application file for complete search history.

*Primary Examiner* — Meiya Li
*Assistant Examiner* — Peter M Albrecht
(74) *Attorney, Agent, or Firm* — Winston Hsu; Scott Margo

(57) ABSTRACT

The present invention provides an organic light emitting diode touch display panel including a substrate, a plurality of first electrodes and a plurality of second electrodes disposed on the substrate, a plurality of light emitting layers, a plurality of dielectric layers, a plurality of first electrode stripes, and a plurality of second stripes. Each light emitting layer is disposed on each first electrode, and each dielectric layer is disposed on each second electrode. Each first electrode stripe is disposed on the light emitting layers in each row, and each second electrode stripe is disposed on the dielectric layers in each row. Each first electrode, each light emitting layer and each first electrode stripe form an organic light emitting diode, and each second electrode, each dielectric layer and each second electrode stripe form a touch sensing capacitor.

13 Claims, 10 Drawing Sheets

ORGANIC LIGHT EMITTING DIODE TOUCH DISPLAY PANEL

BACKGROUND OF THE INVENTION

1. Field of the Invention

The present invention relates to an organic light emitting diode touch display panel, and more particularly, to an organic light emitting diode touch display panel integrated with a capacitive sensing device.

2. Description of the Prior Art

With technology advanced, the organic light emitting diode display panel has been a newly popular flat display because of having advantages of self light emitting, wide viewing angle, fast response time, high illumination efficiency, low operating voltage, thin panel thickness, available to be formed to be flexible panel, and easy process. Thus, the organic light emitting diode display panel can be applied to various flat display products. In addition, with the touch panel having touching function being developed, more and more application products of the touch display panel formed with the touch panel and display panel are invented, such as mobile phone, GPS navigator system, tablet PC, PDA and laptop PC.

The organic light emitting diode touch display panel according to the prior art is formed with an organic light emitting diode display panel and a touch panel. The touch panel is formed on an inner side of a cover glass of the organic light emitting diode display panel so as to be disposed between the cover glass and the organic light emitting diode device or attached to an outer side of the cover glass. Thus, the organic light emitting diode touch display panel of the prior art is formed by integrating the organic light emitting diode panel and the touch panel. However, with the progress of the display being developed toward thin thickness and small size, the method of stacking the organic light emitting diode panel and the touch panel to form the organic light emitting diode touch display panel will limit the thickness and the manufacturing cost of the organic light emitting diode touch display panel.

Therefore, to reduce the thickness and manufacturing cost of the organic light emitting diode touch display panel is an objective in this field.

SUMMARY OF THE INVENTION

It is therefore an objective of the present invention to provide an organic light emitting diode touch display panel to reduce the thickness and manufacturing cost.

According to an embodiment, the present invention provides an organic light emitting diode touch display panel including a substrate, a plurality of first electrodes, a plurality of second electrodes, a plurality of light emitting layers, a plurality of dielectric layers, a plurality of first electrode stripes, a plurality of second electrode stripes, and a plurality of rib stripes. The substrate has a plurality of pixel regions and a peripheral region. The pixel regions are arranged in an array formation, and the peripheral region is disposed at a side of the pixel regions, wherein each pixel region has at least three sub-pixel regions and a sensing region, and the sensing region is disposed at a side of the sub-pixel regions. The first electrodes are disposed on the substrate in the sub-pixel regions respectively. At least one of the second electrodes is disposed on the substrate in each sensing region, wherein the second electrode in each pixel region and the first electrodes in each pixel region are arranged along a first direction in sequence in the pixel regions of each column. Each light emitting layer is disposed on each first electrode. Each dielectric layer is disposed on each second electrode. Each first electrode stripe is disposed on the light emitting layers in the pixel regions of each row. Each second electrode stripe is disposed on the dielectric layers in the pixel regions of each row, wherein each first electrode, each light emitting layer and each first electrode stripe form an organic light emitting diode, and each second electrode, each dielectric layer and each second electrode stripe form a touch sensing capacitor. The rib stripes are disposed on the substrate and sequentially arranged along the first direction. Each rib stripe is disposed between each first electrode stripe and each second electrode stripe adjacent to each other and each first electrode stripe and each second electrode stripe adjacent to each other are electrically insulated from each other by each rib stripe.

According to another embodiment, the present invention provides an organic light emitting diode touch display panel including a first substrate, a plurality of first electrodes, a plurality of second electrodes, a plurality of light emitting layers, a plurality of dielectric layers, a plurality of first electrode stripes, a plurality of second electrode stripes, a plurality of rib stripes, a second substrate, and a plurality of magnetic sensing wire loops. The first substrate has a plurality of pixel regions and a peripheral region. The pixel regions are arranged in an array formation, and the peripheral region is disposed at a side of the pixel regions, wherein each pixel region has at least three sub-pixel regions and a sensing region, and the sensing region is disposed at a side of the sub-pixel regions. The first electrodes are disposed on the first substrate in the sub-pixel regions respectively. At least one of the second electrodes is disposed on the first substrate in each sensing region, wherein the second electrode in each pixel region and the first electrodes in each pixel region are arranged along a first direction in sequence in the pixel regions of each column. Each light emitting layer is disposed on each first electrode. Each dielectric layer is disposed on each second electrode. Each first electrode stripe is disposed on the light emitting layers in the pixel regions of each row. Each second electrode stripe is disposed on the dielectric layers in the pixel regions of each row, wherein each first electrode, each light emitting layer and each first electrode stripe form an organic light emitting diode, and each second electrode, each dielectric layer and each second electrode stripe form a touch sensing capacitor. The rib stripes are disposed on the substrate and sequentially arranged along the first direction. Each rib stripe is disposed between each first electrode stripe and each second electrode stripe adjacent to each other and each first electrode stripe and each second electrode stripe adjacent to each other are electrically insulated from each other by each rib stripe. The second substrate is disposed opposite to the first substrate. The magnetic sensing wire loops are disposed on the second substrate, and each magnetic sensing wire loop is disposed corresponding to each organic light emitting diode.

The organic light emitting diodes and the touch sensing capacitors are formed on the same substrate in the present invention, instead of extra substrate used to dispose the touch sensing capacitors. The magnetic sensing wire loops is directly disposed on the second substrate in the present invention instead of being disposed on the circuit board. Thus, the thickness of the organic light emitting diode touch display panel can be effectively reduced, and the material cost of the substrate and the circuit board can be saved. Also, the manufacturing step of combining the circuit board and the display panel or the touch panel and the display panel can be ignored.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, exemplary embodiments will be detailed as follows. The exemplary embodiments of the present invention are illustrated in the accompanying drawings with numbered elements to elaborate the contents and effects to be achieved.

Figure 1:
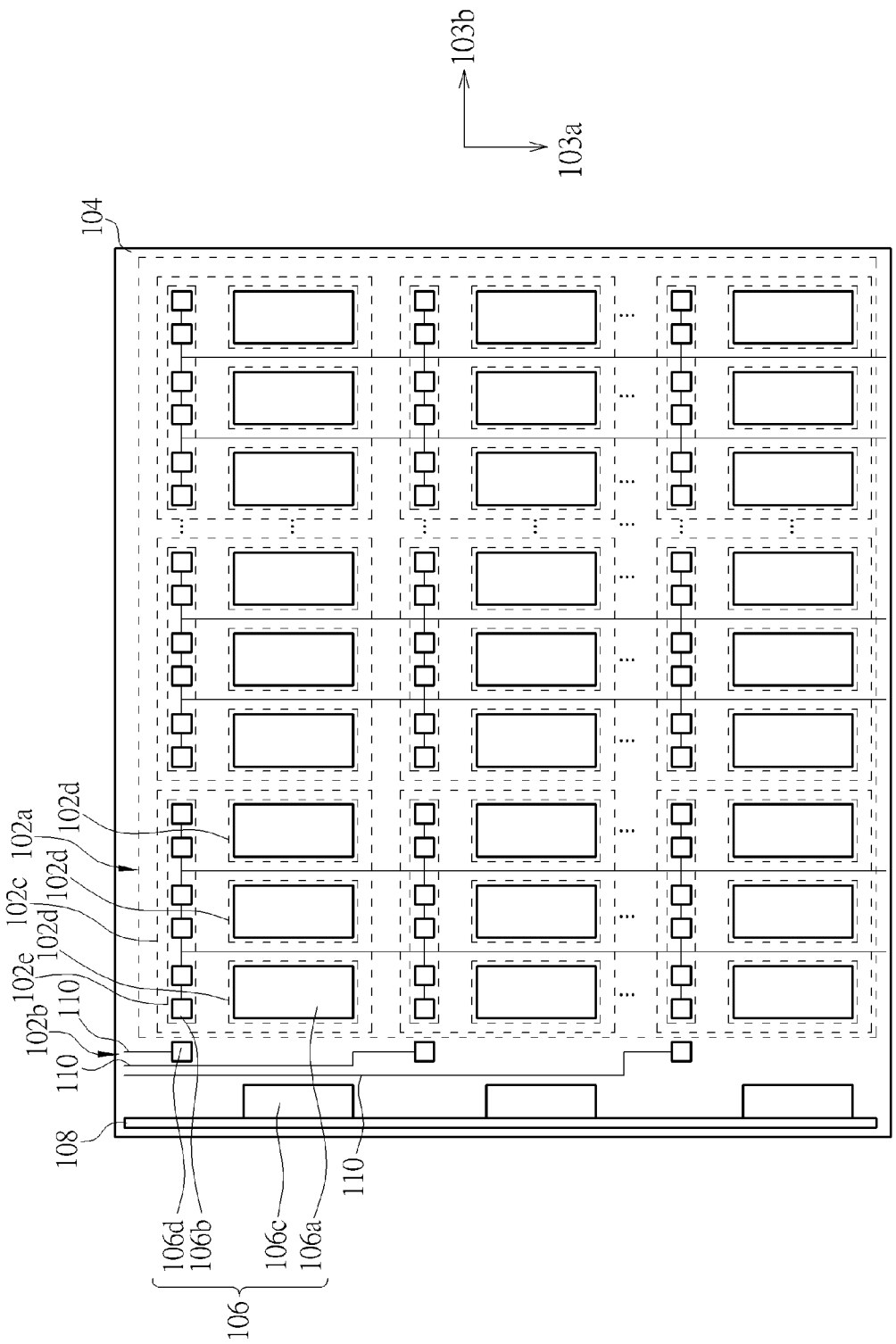
FIG. 1 through FIG. 3 are schematic diagrams illustrating a manufacturing method of an organic light emitting diode touch display panel according to a first embodiment of the present invention.
Figure 2:
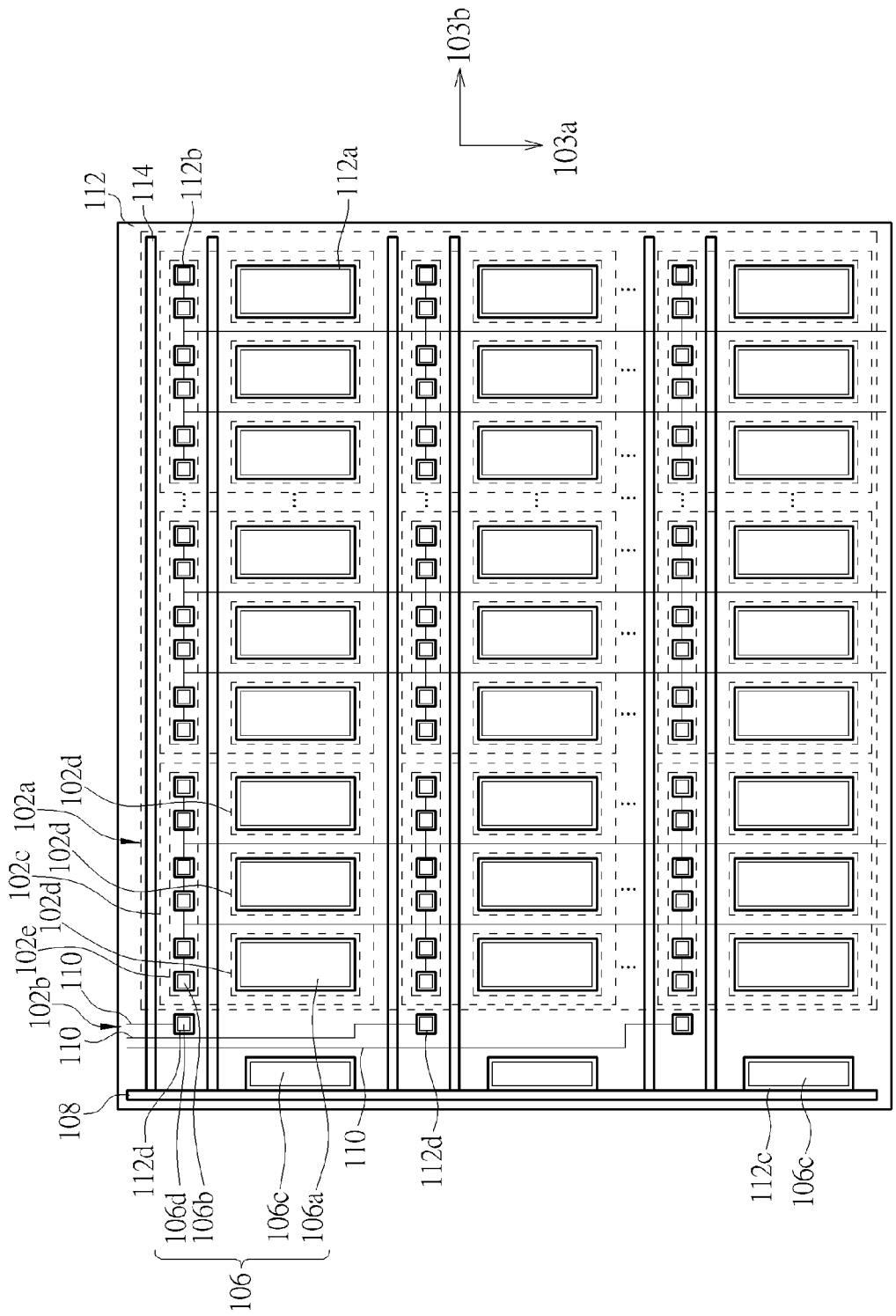
Figure 3:
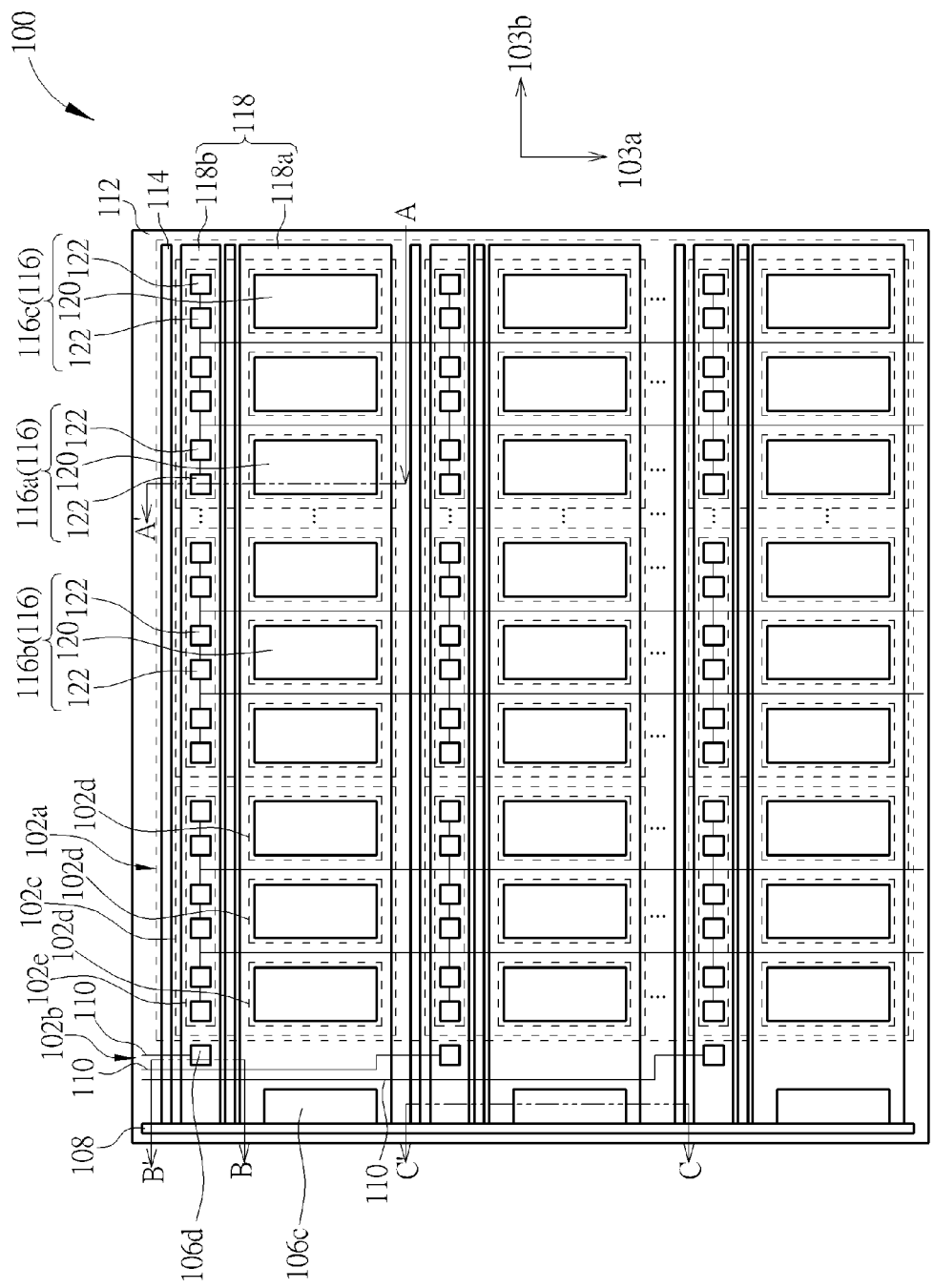

Please refer to FIG. 1 through FIG. 3. FIG. 1 through FIG. 3 are schematic diagrams illustrating a manufacturing method of an organic light emitting diode touch display panel according to a first embodiment of the present invention, wherein FIG. 3 is a schematic diagram illustrating a top view of the organic light emitting diode touch display panel according to the first embodiment of the present invention. As shown in FIG. 1, a first substrate 102, such as glass substrate, plastic substrate or silicon substrate is provided first. The first substrate 102 has a thin-film transistor layer 104 disposed thereon. Next, a photolithographic process and an etching process are performed to form a first patterned conductive layer 106 on the thin-film transistor layer 104. The first substrate 102 has a displaying region 102a and a peripheral region 102b. The displaying region 102a has a plurality of pixel regions 102c arranged in an array formation, and the peripheral region 102b is disposed at a side of the pixel regions 102c or surrounds the pixel regions 102c. The peripheral region 102b is configured to dispose peripheral connecting circuit. Each pixel region 102c is configured to dispose single one pixel structure, and each pixel region 102c has a plurality of sub-pixel regions 102d and a sensing region 102e. In each pixel region 102c, the sensing region 102e is disposed at a side of the sub-pixel regions 102d. In the pixel regions 102c of each column, the sensing region 102e and the sub-pixel regions 102d of each pixel region 102c are sequentially arranged along a first direction 103a, such as column direction. Each sub-pixel region 102d is configured to dispose an organic light emitting diode. Each sensing region 102e is configured to dispose a touch sensing capacitor for sensing touch. In this embodiment, the sub-pixel regions 102d in each pixel region 102c are sequentially arranged along a second direction 103b, such as row direction, and the sub-pixel regions 102d of the pixel regions 102c of the same row are sequentially arranged along the second direction 103b. The present invention is not limited to this. Also, the number of the sub-pixel regions 102d of each pixel region 102c can be three, and the sub-pixel regions 102d are configured to dispose the organic light emitting diodes displaying different colors respectively to generate white light through mixing the colors. Each sensing region 102e corresponds to three sub-pixel regions 102d. Each pixel region of the present invention is not limited to only have three sub-pixel regions. In other embodiments of the present invention, the sub-pixel regions of each pixel region also can be sequentially arranged along the first direction. Each pixel region also can have four or more sub-pixel regions, and the present invention is not limited herein.

In addition, the thin-film transistor layer 104 can include circuit devices configured to control the organic light emitting diodes respectively and configured to electrically connect the first patterned conductive layer 106 to the outside. The first patterned conductive layer 106 includes a plurality of first electrodes 106a, a plurality of second electrodes 106b, a plurality of cathode pads 106c, and a plurality of sensing signal transmitting pads 106d. Each first electrode 106a is disposed on the thin-film transistor layer 104 in each sub-pixel region 106c, and the first electrodes 106a in the pixel regions 102c are arranged along the second direction 103b. The present invention is not limited herein. In this embodiment, there are six second electrodes 106b disposed in each sensing region 102e. The six second electrodes 106b are arranged sequentially along the second direction 103b and electrically connected to each other. The second electrodes 106b in the pixel regions 102c of each row are arranged along the second direction 103b. Accordingly, the second electrodes 106b in the pixel regions 102c of each row and the first electrodes in the pixel regions 102c of each row are sequentially arranged along the first direction 103a, and two of the second electrodes 106b adjacent to each other are disposed corresponding to each first electrode 106a in each sub-pixel region 102d and at a side of each first electrode 106a. The present invention is not limited herein. Also, the second electrodes 106b in the pixel regions 102c of each column are electrically connected to one another, and form an electrode string extending along the first direction 103a. In other embodiments of the present invention, the number of the second electrodes in each sensing region can be at least one. The first electrodes in each pixel region also can be arranged along the first direction.

Furthermore, the first patterned conductive layer 106 can include a transparent conductive material, such as indium tin oxide or indium zinc oxide. Accordingly, light generated by the light emitting layer formed in the following step can penetrate through the first patterned conductive layer 106 and emit out from the first substrate 102. Moreover, each cathode pad 106c is disposed on the thin-film transistor layer 104 in the peripheral region 102b and in the same row as the first electrodes 106a in the pixel region 102c of each row. The cathode pads 106c are electrically connected to one another through a first connecting line 108. Each sensing signal transmitting pad 106d is disposed on the thin-film transistor layer 104 in the peripheral region 102b and in the same row as the second electrodes 106 in the pixel regions 102c of each row. Each sensing signal transmitting pad 106d is electrically connected to a second connecting line 110. The first connecting line 108 and the second connecting lines 110 can be formed with the first patterned conductive layer 106, but the present invention is not limited herein. The first connecting lines and the second connecting lines also can be formed with one of the conductive layers in the thin-film transistor layer.

As shown in FIG. 2, after forming the first patterned conductive layer 106 on the thin-film transistor layer 104, an insulating layer 112 is formed on the thin-film transistor layer 104 and the first patterned conductive layer 106. The insulating layer 112 has a plurality of first openings 112a, a plurality of second openings 112b, a plurality of third openings 112c, and a plurality of fourth openings 112d. Each first opening 112a exposes each first electrode 106a; each second opening 112b exposes each second electrode 106b; each third opening 112c exposes each cathode pad 106c; and, each fourth opening 112d expose each sensing signal transmitting pad 106d. After that, a rib stripe 114 is formed on the insulating layer 112 between the second electrodes 106b in each row and the first electrodes 106a in each row adjacent to each other. Each rib stripe 114 is extended from the pixel regions 102c to the peripheral region 102b, so that each rib stripe 114 also is disposed between each cathode pad 106c and each sensing signal transmitting pad 106d adjacent to each other. In addition, the rib stripes 114 are sequentially arranged on the first substrate and along the first direction 103a. In this embodiment, the rib stripes 114 are formed with insulating material, such as photo resist, oxide or nitride. The present invention is not limited herein.

As shown in FIG. 3, a patterned organic material layer 116 is formed on each first electrode 106a and each second electrode 106b after forming the rib stripes 114. Thereafter, a deposition process is performed to form a second patterned conductive layer 118, and the organic light emitting diode touch display panel of this embodiment is completed. In this embodiment, the patterned organic material layer 116 includes a plurality of light emitting layers 120 and a plurality of dielectric layers 122. The light emitting layers 120 can include organic light emitting material, but the present invention is not limited herein. Each light emitting layer 120 is disposed on each first electrode 106a, and each dielectric layer 122 is disposed on each second electrode 106b. In addition, the patterned organic material layer 116 can be divided into a first patterned organic material layer 116a, a second patterned organic material layer 116b and a third patterned organic material layer 116c, in which the first patterned organic material layer 116a is configured to generate a light of a first color; the second patterned organic material layer 116b is configured to generate a light of a second color; and the third patterned organic material layer 116c is configured to generate a light of a third color. The first color, the second color and the third color are different from one another, and can be mixed to form white color. The present invention is not limited herein. The method of forming the patterned organic material layer 116 in this embodiment is detailed in the following description. A deposition process is performed with a first mask (not shown in figures) only exposing the first electrodes 106a and the second electrodes in the (3n+1)th column to form the first patterned organic material layer 116a on the first electrodes 106a in the (3n+1) th column and the second electrodes 106b corresponding to the first electrodes 106a in the (3n+1)th column, in which n is zero or a positive integral. Then, another deposition process is performed with a second mask (not shown in figures) only exposing the first electrodes 106a and the second electrodes in the (3n+2)th column to form the second patterned organic material layer 116b on the first electrodes 106a in the (3n+2) th column and the second electrodes 106b corresponding to the first electrodes 106a in the (3n+2)th column, and another deposition process is performed with a third mask (not shown in figures) only exposing the first electrodes 106a and the second electrodes in the (3n+3)th column to form the third patterned organic material layer 116c on the first electrodes 106a in the (3n+3)th column and the second electrodes 106b corresponding to the first electrodes 106a in the (3n+3)th column. The present invention is not limited to the above method.

Moreover, the second patterned conductive layer 118 in this embodiment includes a plurality of first electrode stripes 118a and a plurality of second electrode stripes 118b. Each first electrode stripe 118a is disposed on the light emitting layers 120 in the pixel regions 102c of each row and between two of rib stripes 114 adjacent to each other, and each first electrode stripe 118a is extended onto each cathode pad 106c in the peripheral region 102b along the second direction 103b, so that each first electrode stripe 118a can contact each cathode pad 106c. Each second electrode stripe 118b is disposed on the dielectric layer 122 in the pixel regions 102c of each row and between two of rib stripes 114 adjacent to each other, and each second electrode stripe 118b is extended onto each sensing signal transmitting pad 106d in the peripheral region 102b along the second direction 103b, so that each second electrode stripe 118b can contact each sensing signal transmitting pad 106d. Furthermore, each second electrode stripe 118b and each first electrode stripe 118a are sequentially arranged. The second patterned conductive layer 118 in this embodiment includes an opaque conductive material, such as metal, so that light generated from the light emitting layer 120 can be shielded by each first electrode stripe 118a and emit toward the first substrate 102. It should be noted that since the rib stripes 114 is formed on the insulating layer 112 before forming the patterned organic material layer 116, the patterned organic material layer 116 and the second patterned conductive layer 118 can only be formed on the insulating layer 112 between two of the rib stripes 114 adjacent to each other while forming the patterned organic material layer 116 and the second patterned conductive layer 118. Accordingly, each rib stripe 114 can be disposed between each first electrode stripe 118a and each second electrode stripe 118b adjacent to each other. Thus, each rib stripe 114 can insulate the light emitting layer 120 from the dielectric layer 122, and insulate each first electrode stripe 118a from each second electrode stripe 118b.

In the other embodiment of the present invention, a sealant also can be coated on the first substrate after forming the second patterned conductive layer. Then, a second substrate can be covered on the first substrate with the organic light emitting diodes and the touch-sensing capacitors to protect the light emitting diodes and the touch-sensing capacitors, and the sealant can combine the first substrate and the second substrate.

Figure 4:
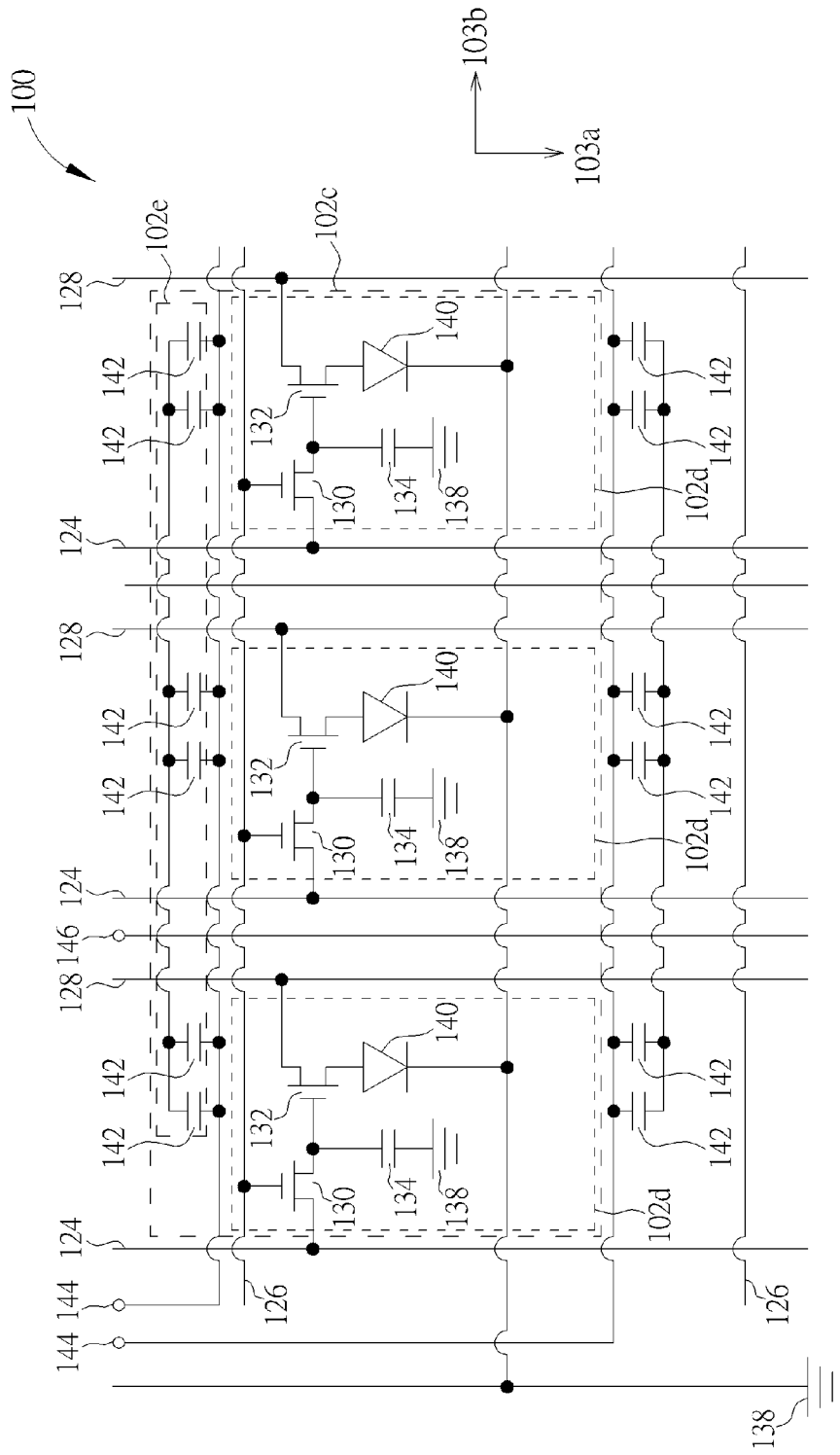
FIG. 4 is a schematic diagram illustrating a circuit in each pixel region shown in FIG. 3.
Figure 5:
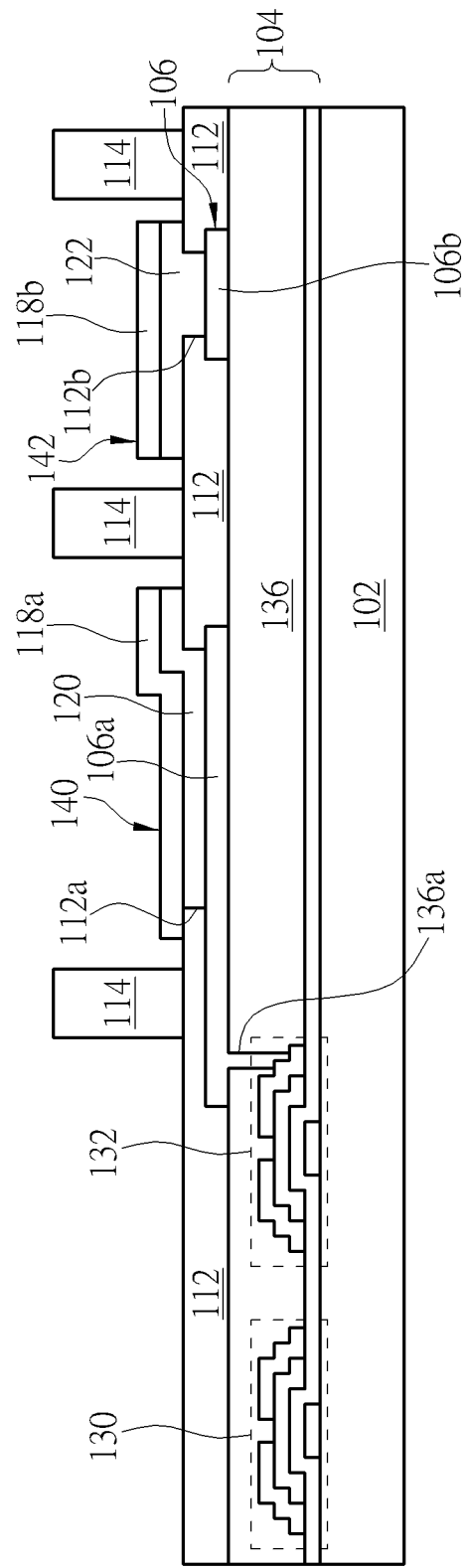
FIG. 5 is a schematic diagram illustrating a cross-sectional view of FIG. 3 taken along a cross-sectional line A-A'.
Figure 6:
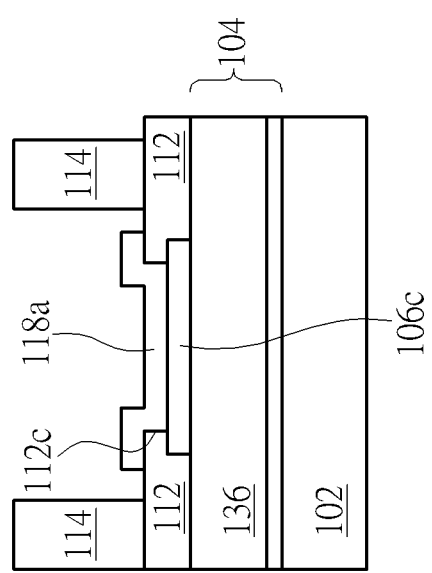
FIG. 6 is a schematic diagram illustrating a cross-sectional view of FIG. 3 taken along a cross-sectional line B-B'.
Figure 7:
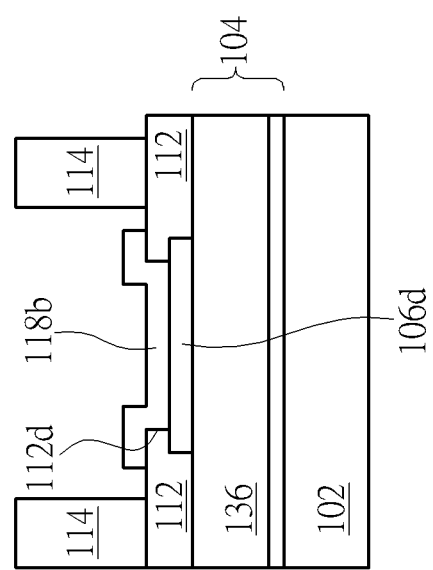
FIG. 7 is a schematic diagram illustrating a cross-sectional view of FIG. 3 taken along a cross-sectional line C-C'.

The structure of the organic light emitting diode touch display panel in this embodiment will be further detailed in the following description. Please refer to FIG. 4 through FIG. 7 together with FIG. 3. FIG. 4 is a schematic diagram illustrating a circuit in each pixel region shown in FIG. 3. FIG. 5 is a schematic diagram illustrating a cross-sectional view of FIG. 3 taken along a cross-sectional line A-A'. FIG. 6 is a schematic diagram illustrating a cross-sectional view of FIG. 3 taken along a cross-sectional line B-B'. FIG. 7 is a schematic diagram illustrating a cross-sectional view of FIG. 3 taken along a cross-sectional line C-C'. As shown in FIG. 3 through FIG. 5, the thin-film transistor layer 104 in this embodiment includes a plurality of data lines 124, a plurality of scan lines 126, a plurality of power lines 128, a plurality of switching transistors 130, a plurality of driving transistors 132, a plurality of capacitors 134, and a planarization layer 136. The data lines 124 are sequentially arranged along the second direction 103b, and the power lines 128 are sequentially arranged along the second direction 103b. Furthermore, each data line 124 and each power line 128 are arranged along the second direction 103b in sequence. The scan lines 126 are sequentially arranged along the first direction 103a. Accordingly, two of the scan lines 126 adjacent to each other and one of data lines 124 and one of the power lines 128 adjacent to each other define a sub-pixel region 102d. Each switching transistor 130, each driving transistor 132 and each capacitor 134 are disposed on the first substrate 102 in each sub-pixel region 102d. The drain D of each switching transistor 130 is electrically connected to the corresponding data line 124. The source S of each switching transistor 130 is electrically connected to the gate G of each driving transistor 132 and an end of each capacitor 134. The gate G of each switching transistor 130 is electrically connected to the corresponding scan line 126. The drain D of each driving transistor 132 is electrically connected to the corresponding power line 128. The other end of each capacitor 134 is electrically connected to the ground 138. Each cathode pad 106c is electrically connected to the ground 138 through the first connecting line 108. The structure of the switching transistors 130 and the driving transistors 132 are familiar to those skilled in the art, so the structure of the switching transistors 130 and the driving transistors 132 are not detailed redundantly. The planarization layer 136 covers the switching transistors 130, the driving transistors 132 and the capacitors 134, so that the planarization layer 136 can electrically insulate the devices disposed on the planarization layer 136 from the switching transistors 130, the driving transistors 132, the capacitors 134, the data lines 124, the scan lines 126 and the power lines 128 disposed under the planarization layer 136. Also, the planarization layer 136 provides a planar surface, so that the light emitting layer 120 disposed thereon can have a planar structure and generate uniform light. The planarization layer has a plurality of fifth openings 136a disposed in the sub-pixel region 102d respectively. Each first electrode 106a can be electrically connected to the source S of each driving transistor 132 through each fifth opening 136a. The thin-film transistor layer is not limited to the above mentioned description, and can be other circuit structure in the present invention.

Each first electrode 106a, each light emitting layer 120 and each first electrode stripe 118a corresponding to each first electrode 106a and each light emitting layer 120 in each sub-pixel region 102d are stacked on the thin-film transistor layer 104 in sequence, and form an organic light emitting diode 140, in which each organic light emitting diode 140 is disposed between each data line 124 and each power line 128 adjacent to each other and utilized to display each pixel of a frame. In this embodiment, each first electrode stripe 118a serves as a cathode of each organic light emitting diode 140, and is electrically connected to the ground 138. Each first electrode 106a serves as an anode of each organic light emitting diode 140, and is electrically connected to the source S of each driving transistor 132. The switch of each organic light emitting diode 140 in each sub-pixel region 102d can be controlled with each switching transistor 130, and the gray level of the light generated from each organic light emitting diode 140 in each sub-pixel region 102d can be controlled with each driving transistor 132. Furthermore, when each organic light emitting diode 140 is driven by providing a forward bias, each light emitting layer 120 will generate light. It should be noted that the first electrodes 106a in this embodiment includes a transparent conductive material, and the first electrode stripes 118a include an opaque conductive material, so that the organic light emitting diode touch display panel 100 can be a bottom emission type display panel. The circuit devices, such as data lines 124, the scan lines 126, the power lines 128, the switching transistors 130, the driving transistors 132 and capacitors 134, in the thin-film transistor layer 104 do not overlap the organic light emitting diodes 140 for generating light, so that the light generated from the organic light emitting diodes 140 can be prevented from being shielded. In other embodiment of the present invention, the first electrode can include opaque conductive material, and the second electrode can include transparent conductive material, so that the light generated from the organic light emitting diode emits upward. Accordingly, the organic light emitting diode touch sensing display device is a top emission type display panel. Also, the circuit device in the thin-film transistor layer can overlap the organic light emitting diode for generating light in this case.

Furthermore, each second electrode 106b, each dielectric layer 122 and each corresponding second electrode stripes 118b are stacked on the thin-film transistor layer 104 in sequence, and form a touch sensing capacitor 142. Each second electrode stripe 118b is electrically connected to a sensing signal transmitting end 144 through each second connecting line 110. Each electrode string formed with the second electrodes 106b in the pixel regions 102c of each column is electrically connected to a sensing signal receiving end 146, and crosses the second electrode stripes 118b. Accordingly, each touch sensing capacitor 126 can be utilized to sensing the position being touched. It should be noted that the dielectric layer 122 of each touch sensing capacitor 142 is formed with an organic light emitting material, so that each touch sensing capacitor 142 is operated in reverse bias to avoid each touch sensing capacitor 142 generating light. In other words, when each first electrode stripe 118a and each first electrode 106a serve as the cathode and the anode of each organic light emitting diode 140, each second electrode stripe 118b that is formed with the same conductive material as the first electrode stripes 118a has higher potential than each second electrode 106b that is formed with the same conductive material as the first electrodes 106a. Moreover, the sensing method of the touch sensing capacitor 142 in this embodiment is to transmit driving signals to the second electrode stripes 118b in sequence from the sensing signal transmitting ends 144 and then to receive the signals sensed with the electrode strings through the sensing signal receiving ends 146. When the touch object touches the organic light emitting diode touch display panel 100, the capacitance of the touch sensing capacitor disposed corresponding to the position being touched will be changed, and the electrode strings corresponding to the position being touched will sense the change of the capacitance. Accordingly, the position being touched can be calculated. The organic light emitting diode touch display panel of the present invention is not limited to use the above-mentioned sensing method.

As shown in FIG. 6, each first electrode stripe 118a is in contact with each cathode pad 106c through each third opening 112c, and is electrically connected to the ground 138 through the first connecting line 108. As shown in FIG. 7, each second electrode stripe 118b is in contact with each sensing signal transmitting pad 106d through each fourth opening 112d, and is electrically connected to each sensing signal receiving end 144 through each second connecting line 110. Furthermore, each electrode string formed with second electrodes 106b in the pixel regions 102c of each column is electrically connected to each sensing signal receiving end 146.

It should be noted that the organic light emitting diodes 140 and the touch sensing capacitor 142 are formed on the same first substrate 102, so that extra substrate do not require to dispose the touch sensing capacitors, and the thickness of the organic light emitting diode touch display panel can be effectively reduced. Furthermore, the touch sensing capacitors 142 and the organic light emitting diodes 140 can be formed at the same time, so that the manufacturing cost of the organic light emitting touch display panel 100 can be effectively decreased.

The organic light emitting diode touch display panel in the present invention is not limited to the above-mentioned embodiment. The following description continues to detail the other embodiments or modifications, and in order to simplify and show the differences between the other embodiments or modifications and the above-mentioned embodiment, the same numerals denote the same components in the following description, and the same parts are not detailed redundantly.

Figure 8:
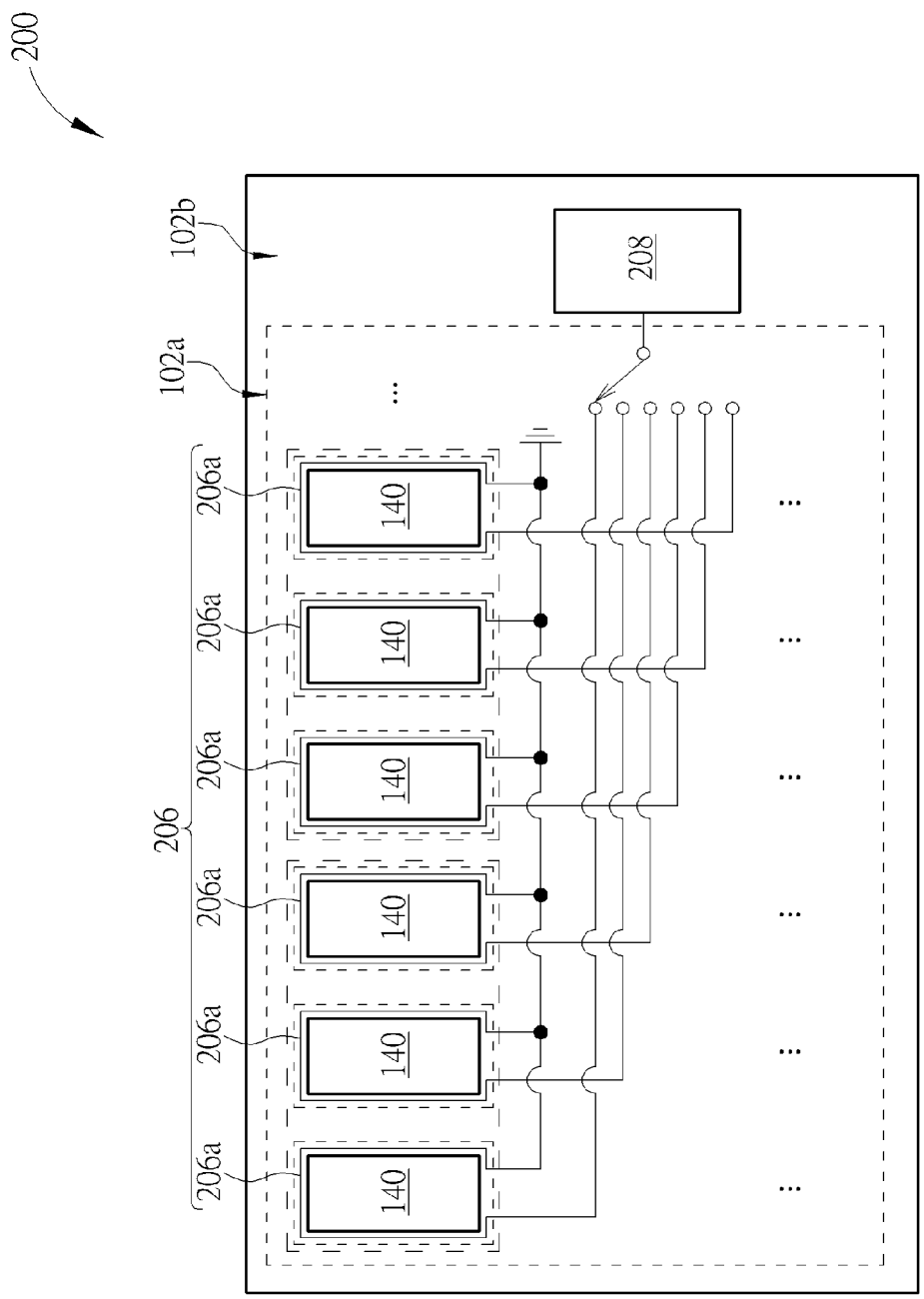
FIG. 8 is a schematic diagram illustrating a top view of an organic light emitting diode touch display panel according to a second embodiment of the present invention.
Figure 9:
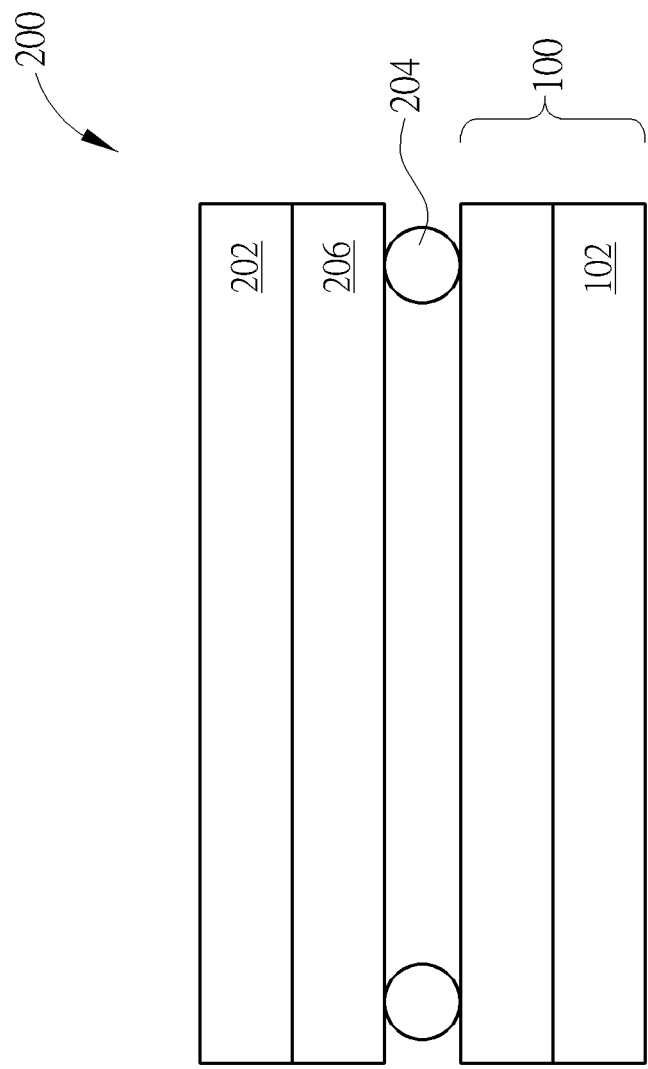
FIG. 9 is a schematic diagram illustrating a cross-sectional view of an organic light emitting diode touch display panel according to the second embodiment of the present invention.

Please refer FIG. 8 and FIG. 9 together with FIG. 5. FIG. 8 is a schematic diagram illustrating a top view of an organic light emitting diode touch display panel according to a second embodiment of the present invention, and FIG. 9 is a schematic diagram illustrating a cross-sectional view of an organic light emitting diode touch display panel according to the second embodiment of the present invention. As shown in FIG. 5, FIG. 8 and FIG. 9, the difference between the first embodiment and this embodiment is that the organic light emitting diode touch display panel 200 in this embodiment further includes a second substrate 202, a sealant 204, a third patterned conductive layer 206, and at least one driving device 208. The second substrate 202 is disposed opposite to the first substrate 102, and the organic light emitting diodes 140 and the touch sensing capacitors 142 are disposed between the first substrate 102 and the second substrate 202, so that the second substrate 202 can be used to protect the organic light emitting diodes 140 and the touch sensing capacitors 142. The second substrate can be for example such as a glass substrate, a plastic substrate or a silicon substrate. In this embodiment, the third patterned conductive layer 206 includes a plurality of magnetic sensing wire loops 206a disposed on an inner surface of the second substrate 202 facing the first substrate 102. The magnetic sensing wire loops 206a can be formed with conductive material, such as metal wire, but the present invention is not limited herein. Each magnetic sensing wire loop 206a is disposed corresponding to each organic light emitting diode 140 in each pixel region 102c, and a region surrounded by each magnetic sensing wire loop 206a can overlap each organic light emitting diode 140. The sealant 204 is disposed between the first substrate 102 and the second substrate 202, and is configured to make the second substrate 202 adhere to the first substrate 102. The driving device 208 is disposed on the inner surface of the second substrate 202 facing the first substrate 103 and corresponding to the first substrate 102 in the peripheral region 102b, so that the light generated from the organic light emitting diodes 140 can be prevented from being shielded with the driving device 208. Furthermore, the driving device 208 can be configured to receive the signal sensed by each magnetic sensing wire loop 206a and execute a corresponding function. The present invention is not limited herein. It should be noted that the magnetic sensing wire loops 206a in this embodiment are directly disposed on the second substrate 202 used for protecting the organic light emitting diodes 140 and the touch sensing capacitors 142 instead of being disposed on a circuit board and then combined with the display panel. Accordingly, the material cost of the circuit board can be saved; the thickness of the organic light emitting diode touch display panel 100 can be reduced; and the manufacturing steps for combining the circuit board and the display panel can be ignored. In addition, the first electrodes 106a in this embodiment is formed with a transparent conductive material, and the first electrode stripes 118a is formed with an opaque conductive material. Thus, the light generated from the organic light emitting diodes 140 will not be shielded with the magnetic sensing wire loops 206a, and the appearance of the organic light emitting diode touch display panel 100 will not be affected by the magnetic sensing wire loops 206a. Moreover, the magnetic sensing wire loops 206a can generates current when a magnetic pencil applies a difference of a magnetic field to the magnetic sensing wire loops 206a, so that one of the magnetic sensing wire loops 206a disposed corresponding to the position being touched can generate sensing current when the magnetic pencil is close to the magnetic sensing wire loop 206a or in contact with the organic light emitting diode touch display panel 100. Accordingly, the position being touched can be detected.

Figure 10:
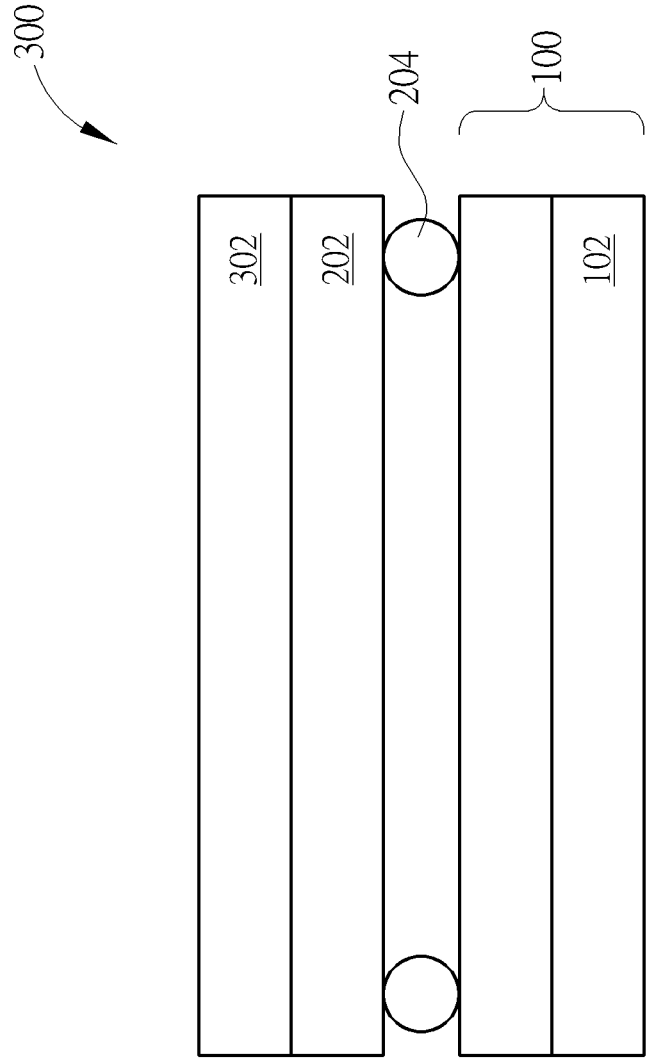
FIG. 10 is a schematic diagram illustrating a cross-sectional view of an organic light emitting diode touch display panel according to the third embodiment of the present invention.

Please refer to FIG. 10. FIG. 10 is a schematic diagram illustrating a cross-sectional view of an organic light emitting diode touch display panel according to the third embodiment of the present invention. As shown in FIG. 10, the difference between the second embodiment and this embodiment is that the third patterned conductive layer 302 including the magnetic sensing wire loops is disposed on an outer surface of the second substrate 202 in the organic light emitting diode touch display panel 300 of this embodiment.

In summary, the organic light emitting diodes and the touch sensing capacitors are formed on the same substrate in the present invention, instead of extra substrate used to dispose the touch sensing capacitors. The magnetic sensing wire loops is directly disposed on the second substrate in the present invention instead of being disposed on the circuit board. Thus, the thickness of the organic light emitting diode touch display panel can be effectively reduced, and the material cost of the substrate and the circuit board can be saved. Also, the manufacturing step of combining the circuit board and the display panel or the touch panel and the display panel can be ignored. Furthermore, the touch sensing capacitors and the organic light emitting diodes can be formed at the same time, so that the manufacturing cost of the organic light emitting touch display panel also can be effectively decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light emitting diode touch display panel, comprising:

a substrate, having a plurality of pixel regions and a peripheral region, wherein the pixel regions are arranged in an array formation, and the peripheral region is disposed at a side of the pixel regions, wherein each pixel region has at least three sub-pixel regions and a sensing region disposed at a side of the sub-pixel regions;

a plurality of first electrodes, disposed on the substrate in the sub-pixel regions respectively;

a plurality of second electrodes, and at least one of the second electrodes being disposed on the substrate in each sensing region, wherein the at least one of the second electrodes in each pixel region and the first electrodes in each pixel region are arranged along a first direction in sequence in the pixel regions of each column;

a plurality of light emitting layers, and each light emitting layer being disposed on each first electrode;

a plurality of dielectric layers, and each dielectric layer being disposed on each second electrode;

a plurality of first electrode stripes, and each first electrode stripe being disposed on the light emitting layers in the pixel regions of each row;

a plurality of second electrode stripes, and each second electrode stripe being disposed on the dielectric layers in the pixel regions of each row, wherein each first electrode, each light emitting layer and each first electrode stripe form an organic light emitting diode, and each second electrode, each dielectric layer and each second electrode stripe form a touch sensing capacitor; and a plurality of rib stripes, disposed on the substrate sequentially arranged along the first direction, wherein each rib stripe is disposed between each first electrode stripe and each second electrode stripe adjacent to each other, and each first electrode stripe and each second electrode stripe adjacent to each other are electrically insulated from each other by each rib stripe, wherein each of the light emitting layers and each of the dielectric layers are formed with a same layer of organic light emitting material, and a reverse bias is applied to each touch sensing capacitor to avoid each touch sensing capacitor generating light.

2. The organic light emitting diode touch display panel according to claim 1, further comprising a plurality of cathode pads, disposed on the substrate in the peripheral region, wherein each cathode pad is electrically connected to each first electrode stripe, and each cathode pad overlaps each first electrode stripe.

3. The organic light emitting diode touch display panel according to claim 1, further comprising a plurality of sensing signal transmitting pads, disposed on the substrate in the peripheral region, wherein each sensing signal transmitting pad is electrically connected to each second electrode stripe, and each sensing signal transmitting pad overlaps each second electrode stripe.

4. The organic light emitting diode touch display panel according to claim 1, further comprising a thin-film transistor layer, disposed between the first electrodes and the substrate, wherein the thin-film transistor layer comprises a plurality of driving transistors and a plurality of capacitors.

5. The organic light emitting diode touch display panel according to claim 1, wherein the first electrodes comprise a transparent conductive material, and the first electrode stripes comprise an opaque conductive material.

6. An organic light emitting diode touch display panel, comprising:

a first substrate, having a plurality of pixel regions and a peripheral region, wherein the pixel regions are arranged in an array formation, and the peripheral region is disposed at a side of the pixel regions, wherein each pixel region has at least three sub-pixel regions and a sensing region, and the sensing region is disposed at a side of the sub-pixel regions;

a plurality of first electrodes, disposed on the first substrate in the sub-pixel regions respectively;

a plurality of second electrodes, and at least one of the second electrodes being disposed on the first substrate in each sensing region, wherein the at least one of the second electrodes in each pixel region and the first electrodes in each pixel region are arranged along a first direction in sequence in the pixel regions of each column;

a plurality of light emitting layers, and each light emitting layer being disposed on each first electrode;

a plurality of dielectric layers, and each dielectric layer being disposed on each second electrode;

a plurality of first electrode stripes, and each first electrode stripe being disposed on the light emitting layers in the pixel regions of each row;

a plurality of second electrode stripes, and each second electrode stripe being disposed on the dielectric layers in the pixel regions of each row, wherein each first electrode, each light emitting layer and each first electrode stripe form an organic light emitting diode, and each second electrode, each dielectric layer and each second electrode stripe form a touch sensing capacitor;

a plurality of rib stripes, disposed on the first substrate sequentially arranged along the first direction, wherein each rib stripe is disposed between each first electrode stripe and each second electrode stripe adjacent to each other, and each first electrode stripe and each second electrode stripe adjacent to each other are electrically insulated from each other by each rib stripe;

a second substrate, disposed opposite to the first substrate; and a plurality of magnetic sensing wire loops, disposed on the second substrate, wherein each magnetic sensing wire loop is disposed corresponding to each organic light emitting diode, wherein each of the light emitting layers and each of the dielectric layers are formed with a same layer of organic light emitting material, and a reverse bias is applied to each touch sensing capacitor to avoid each touch sensing capacitor generating light.

7. The organic light emitting diode touch display panel according to claim 6, wherein the magnetic sensing wire loops are disposed on an inner surface of the second substrate facing the first substrate.

8. The organic light emitting diode touch display panel according to claim 6, wherein the magnetic sensing wire loops are disposed on an outer surface of the second substrate.

9. The organic light emitting diode touch display panel according to claim 6, further comprising a sealant disposed between the first substrate and the second substrate.

10. The organic light emitting diode touch display panel according to claim 6, further comprising a thin-film transistor layer, disposed between the first electrodes and the first substrate, wherein the thin-film transistor layer comprises a plurality of driving transistors and a plurality of capacitors.

11. The organic light emitting diode touch display panel according to claim 6, wherein the first electrodes comprise a transparent conductive material, and the first electrode stripes comprise an opaque conductive material.

12. The organic light emitting diode touch display panel according to claim 6, further comprising a plurality of cathode pads, disposed on the first substrate in the peripheral region, wherein each cathode pad is electrically connected to each first electrode stripe, and each cathode pad overlaps each first electrode stripe.

13. The organic light emitting diode touch display panel according to claim 6, further comprising a plurality of sensing signal transmitting pads, disposed on the first substrate in the peripheral region, wherein each sensing signal transmitting pad is electrically connected to each second electrode stripe, and each sensing signal transmitting pad overlaps each second electrode stripe.

* * * * *